Figure 1A:
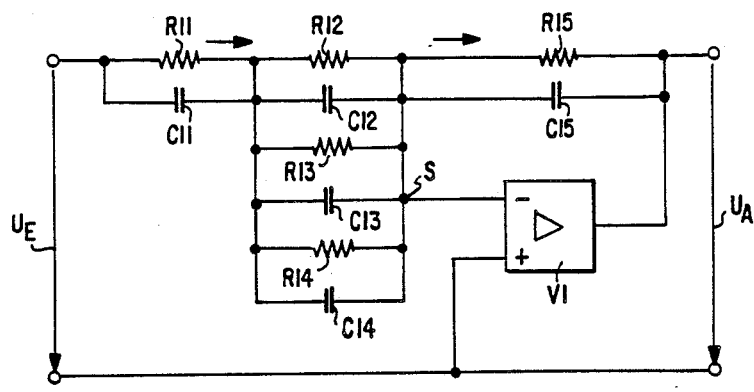

United States Patent [19]

Koslar

[11] Patent Number: 4,897,599
[45] Date of Patent: Jan. 30, 1990

[54] SIGNAL PROCESSING DEVICE WITH A LEVEL ADAPTER CIRCUIT

[75] Inventor: Manfred Koslar, Berlin, Fed. Rep. of Germany

[73] Assignee: Createc Gesellschaft für Elektrotechnik mbH, Berlin, Fed. Rep. of Germany

[21] Appl. No.: 945,958
[22] PCT Filed: Mar. 27, 1986
[86] PCT No.: PCT/DE86/00143
§ 371 Date: Nov. 28, 1986
§ 102(e) Date: Nov. 28, 1986
[87] PCT Pub. No.: WO86/05886
PCT Pub. Date: Oct. 9, 1986

[30] Foreign Application Priority Data

Mar. 27, 1985 [DE] Fed. Rep. of Germany ....... 3511593
Mar. 27, 1985 [DE] Fed. Rep. of Germany ....... 3511590

[51] Int. Cl.⁴ .................... G01R 13/20; G01R 19/00
[52] U.S. Cl. .................... 324/115; 324/116; 324/121 R; 324/130; 364/571
[58] Field of Search ............... 307/490; 324/115, 116, 324/119, 121 R, 123 R, 130, 73 R, 74; 364/571; 330/9; 328/127, 128, 162, 163

[56] References Cited

U.S. PATENT DOCUMENTS

| | | | |
|---|---|---|---|
| 3,243,699 | 3/1966 | Kummer | 324/130 |
| 3,381,231 | 4/1968 | Gilbert | 328/127 |
| 3,566,282 | 2/1971 | Lanker et al. | 328/127 |
| 3,652,934 | 3/1972 | Paljug et al. | 324/123 R |
| 3,656,053 | 4/1972 | Richman | 324/121 R |
| 3,772,617 | 11/1973 | Ciesielka | 333/18 |
| 3,781,869 | 12/1973 | Sudnick et al. | 364/571 |
| 3,822,401 | 7/1974 | Parker | 324/115 |
| 4,000,463 | 12/1976 | Katzmann et al. | 324/115 |
| 4,200,933 | 4/1980 | Nickel et al. | 324/130 |
| 4,255,706 | 3/1981 | Sosjian | 324/115 |
| 4,329,641 | 5/1982 | Ikeda et al. | 324/115 |
| 4,364,027 | 12/1982 | Murooka | 324/130 |
| 4,414,638 | 11/1983 | Iakambiras | 364/571 |
| 4,446,438 | 3/1984 | Chang et al. | 328/127 |
| 4,459,698 | 7/1984 | Yumoto et al. | 333/18 |
| 4,473,797 | 9/1984 | Shiota | 324/115 |
| 4,517,550 | 5/1985 | Nakamura et al. | 324/130 |
| 4,531,089 | 7/1985 | Ishimuka et al. | 324/123 R |
| 4,553,091 | 11/1985 | Bristol | 324/121 R |

FOREIGN PATENT DOCUMENTS

| | | | |
|---|---|---|---|
| 2162337 | 12/1970 | Fed. Rep. of Germany. | |
| 0004044 | 1/1979 | Japan | 328/127 |
| 0206220 | 12/1983 | Japan | 333/81 R |
| 0091739 | 5/1984 | Japan | 333/18 |

OTHER PUBLICATIONS

"A New and Unique Analog-to-Digital Conversion Technique", by McCullough, IEEE Trans. on Ins. & Meas., IM-15, #4, 12/66, pp. 276-283.

Primary Examiner—Reinhard J. Eisenzopf
Assistant Examiner—W. Burns
Attorney, Agent, or Firm—Spencer & Frank

[57] ABSTRACT

A signal processing device having a level adapter circuit, in particular a broad band oscilloscope, having an operational amplifier with an amplification factor determined by the ratio of a first resistor between the signal input and the inverting input of the operational amplifier—the virtual ground—and a second resistor between the inverting input of the operational amplifier and the signal output, in which the resistors may optionally be complex, in which at least one parallel resistor is provided for the first resistor, the first terminal of which is firmly connected to the signal input or a connecting point of a plurality of partial resistors forming the first resistor, and the second terminal of which can be switched over between the inverting input of the operational amplifier, which input forms the virtual ground, and the real reference potential for the amplifier input.

17 Claims, 3 Drawing Sheets

SIGNAL PROCESSING DEVICE WITH A LEVEL ADAPTER CIRCUIT

DESCRIPTION

The invention relates to a signal processing device of the type defined by the preamble to claim 1.

Level adapter circuits are used in signal processing devices in order to provide adaptation to the dynamic range of the signal processing in the device when there are different signal amplitudes.

A device of this kind is known from German patent document DE-A1 21 62 337. In the known device, the ratio of the resistors of a potentiometrically wired operational amplifier is varied by means of various switches. In this circuit, one problem is that the input resistance varies in the different switch positions, and another is that considerable shielding problems arise with high-resistance signal processing. Moreover the input is not free of potential, and compensation voltages cannot readily be supplied for balancing direct voltage.

The invention defined by claim 1 has the object of disclosing a signal processing device of the above type which enables a simple construction, in particular inside a compact measuring instrument (that is, one that is hand-held).

The invention is based on the recognition that with an input amplifier to be operated in the manner of an operational amplifier, the switchover of the input voltage ranges by means of variations can take place only in the range of virtual ground, so that the breakpoints are restricted neither by stray potentials nor by high voltages to be applied.

From the requirements for a high dynamic range, for a simultaneously broad band, and for a high-resistance and reliable input resistor, the result is the construction of a calibration circuit with high-resistance resistors, because this construction has to be equipped with compensating capacitances. To reduce the expense for components and balancing, two divider stages, separated by a preamplifier, are used: one decade divider, and one step divider; the step divider may be wired with relatively low resistance.

To keep the amplification factors as low as possible, a fundamental input division is avoided. To this end, it is advantageous that the input is not delivered to the noninverting input of a dividing amplifier, as is otherwise usually done, but instead a discretely constructed operational amplifier, wired potentiometrically, is used. This has the advantage of being able to operate with an active resistor at the input, without having to accept an attenuation of potential.

The summation point thereby attained at the input of the amplifier is very favorable for other reasons. If correctly designed it is potential-free and at the same time represents a virtual ground; advantageously, an additional regulating voltage can be delivered to this point, which can be used for a direct current shift or for an automatic null calibration. This in turn lessens the requirements for direct voltage stability of the amplifier and with appropriate circuitry lends the opportunity of fully automatic null control and calibration. It is thereby possible to meet the requirements for null stability, measurement accuracy and long-term stability as well as, in combination with the computer, for fully automatic measurement of the alternating voltage and direct voltage component of the signal. One of the decisive advantages of this system, however, is its very advantageous divider.

The virtual ground of the input of the potentiometrically wired operational amplifier makes it possible to meet the demand for high and constant input resistance for all switch stages and to obtain an input current divider. Because the amplifier is "current controlled", the invention provides the opportunity of dividing the input current.

All the divider resistances can be calculated by the rules for parallel connection of resistors, and the input-side resistors are switched over between the virtual ground point of the potentiometrically wired amplifier and the reference potential of the input. As a result of the parallel circuit, the voltage amplification of the amplifier is decreased accordingly. A fixed resistor remains in the input, so that on the input side various T resistor configurations up to a combined longitudinal resistor in the input are the result; the transverse branch need not be taken into consideration in calculating the current flowing into the amplifier.

The invention is based on the recognition that the reference potential for the input and output signal of the operational amplifier and the virtual ground can be conceptually combined. Thus the ratios (and hence the input resistance toward the amplifier) remain constant for the input signal—with reference to the connecting point, which remains independent from the switching state—and the reference or virtual ground potential.

The amplification factor of the operational amplifier circuit, in contrast, is determined solely by the partial resistor connected to the virtual ground and is correspondingly switchable.

The additional active resistor in the input serves to provide electrical safety and effects a reduction of the current with respect to the connecting point.

In comparison with otherwise typical divider circuits, minimal values for the capacitances arise here as well. The further advantages of this very favorable configuration will also be listed here:

A minimum of precision resistors are necessary.

All the stray capacitance, dictated by geometry of the components and tracks to the switches remain constant, because all the components in all the switch positions are always connected to ground in the same manner, either to the virtual ground or the actual ground.

The preresistor is of relatively high resistance (approximately 1 M$\Omega$); this means extreme operating reliability, as long as the associated capacitance is embodied as voltageproof.

The input capacitance, at approximately 20 pF, is relatively low.

In the stage of highest sensitivity, the amplifier, in contrast to an amplifier connected in a noninverting manner, and despite the high resistance, can operate without fundamental division of 6 dB; in contrast thereto, it affords an additional amplification possibility—preferably by approximately a factor of 5.

Simple construction of the switch (only one contact change per divider stage) and hence favorable realization made possible by integrated analog switches using CMOS technology.

The load of the signal input is constant.

The current in the feedback branch is constant.

Since the actual active resistor for the level adaptation in the feedback network of the operational amplifier is a combination of one or more resistors and the number of resistors in total is at a minimum, the load of the object being tested, because of the parallel circuit, is also at a minimum.

A preceding safety resistor, it is therefore also possible to design it for a minimum circuit, thereby offering a maximum of safety.

In order to attain a null drift of the measurement signal in known signal processing devices, that is, a shift of the direct voltage component, complicated provisions must be made, which in particular require feeding variable voltage levels to internal circuit points of the measuring amplifiers. The effect of a particular drift can be judged only with difficulty at the outset, so that in accordance with the intended application an escalation of the voltages to be supplied must be performed, which must be adapted to the particular application. In particular, it is also disadvantages that in an automatic null drift compensation the drift voltages within individual amplifier stages also become part of the calculation and in this sense a complete compensation of the direct voltage reference point is variably attainable only by making complicated provisions.

The arrangement disclosed has the object of disclosing an input circuit of the above type in which a null drift compensation or calibration of the device is possible in a simple manner.

The invention is based on the recognition that in using a potentiometrically connected signal amplifier in the manner of an operational amplifier, the feeding of an additional voltage causes a direct voltage shift of the signal, the voltage shifting being possible without affecting other signal stages. Since at this point no potential leads toward the reference level for the input voltage, a disruptive feedback of the signal to the source of the compensating voltage does not occur either. By balancing with a reference signal, a direct voltage balancing can be performed regularly during pauses in the signal recording between periodically appearing input signals, so that the requirements for freedom from drift of the direct voltage amplifier are lowered accordingly.

In a measuring device having digital signal processing, the direct voltage compensation is preferably performed in such a manner that, under the control of the digital signal processing portion via a digital/analog converter, an analog signal of constant amplitude is generated, which is delivered to the input of the potentiometrically wired operational amplifier at the point of virtual ground, and via a further analog/digital converter, a compensation signal is supplied, which is varied until such time as the output signal "zero" appears in the analog input portion of the measuring device of the following digital evaluation portion. There are two possibilities for further processing, that is, either the compensation signal continues to be supplied in analog fashion during the following measurement operations, or during these measurements, with a shutoff of the analog compensation signal, the digital results are corrected by the digital value corresponding to the compensation signal that is to be supplied in an analog manner.

In a preferred further embodiment of the invention, the above-described signal route is used for calibration, that is, in particular for linearization of the analog input portion. In the time intervals available for calibration, between sequential measurement events, an analog signal is supplied, which is generated by means of a digital signal via the digital/analog converter, the digital signal being varied in preferably equidistant stages. The digital output signal appearing at the output of the analog/digital converter following the measurement amplifier is compared in its various stages with the original incrementally varied digital input signal, and the input and output signals are stored in common in a memory embodied in tabular form. In this manner, all the digital signal values are corrected by means of the table, which assures a linear signal transmission over the entire input range.

In another preferred further embodiment of the invention, an application is also possible with respect to the alternating voltage behavior of the input portion. The calibration is effected separately, in a favorable manner, for different measurement ranges, and an inquiry signal that identifies the position of the input divider is used to address digital values associated with the various measurement ranges, that are stored in various memory ranges.

Figure 1B:
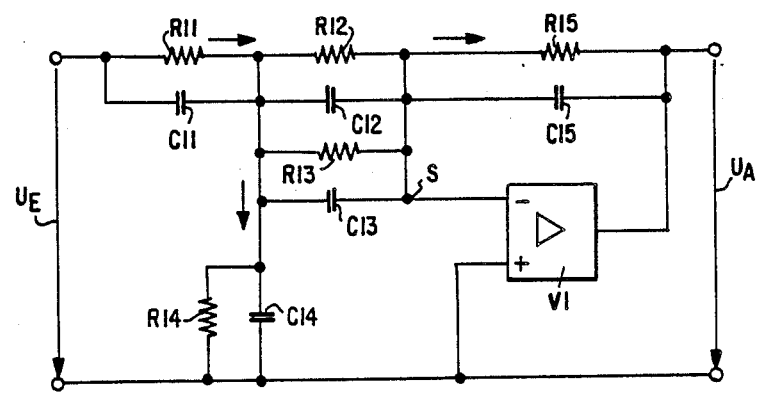
Figure 1C:
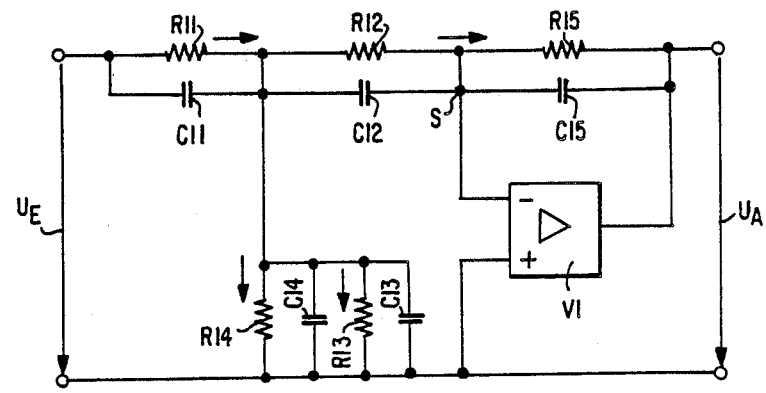
Figure 2:
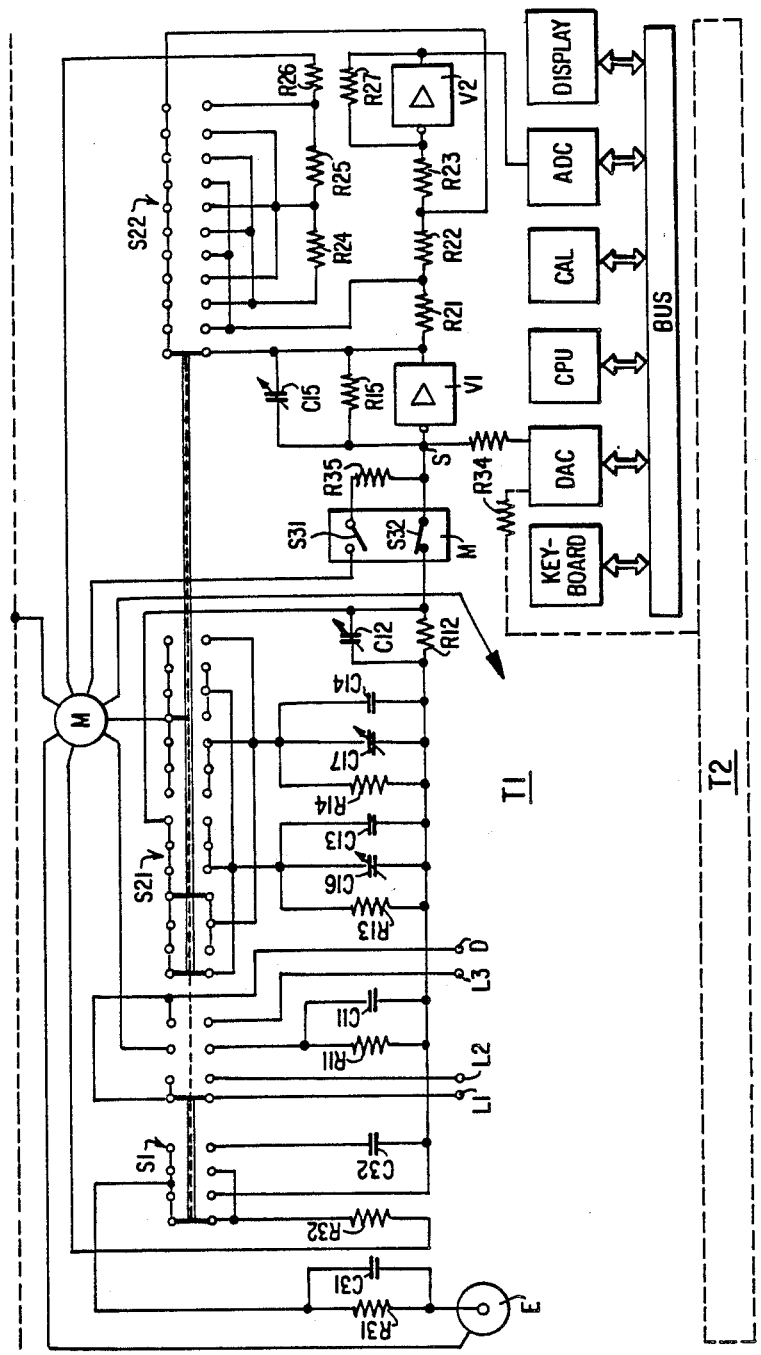
Figure 3:
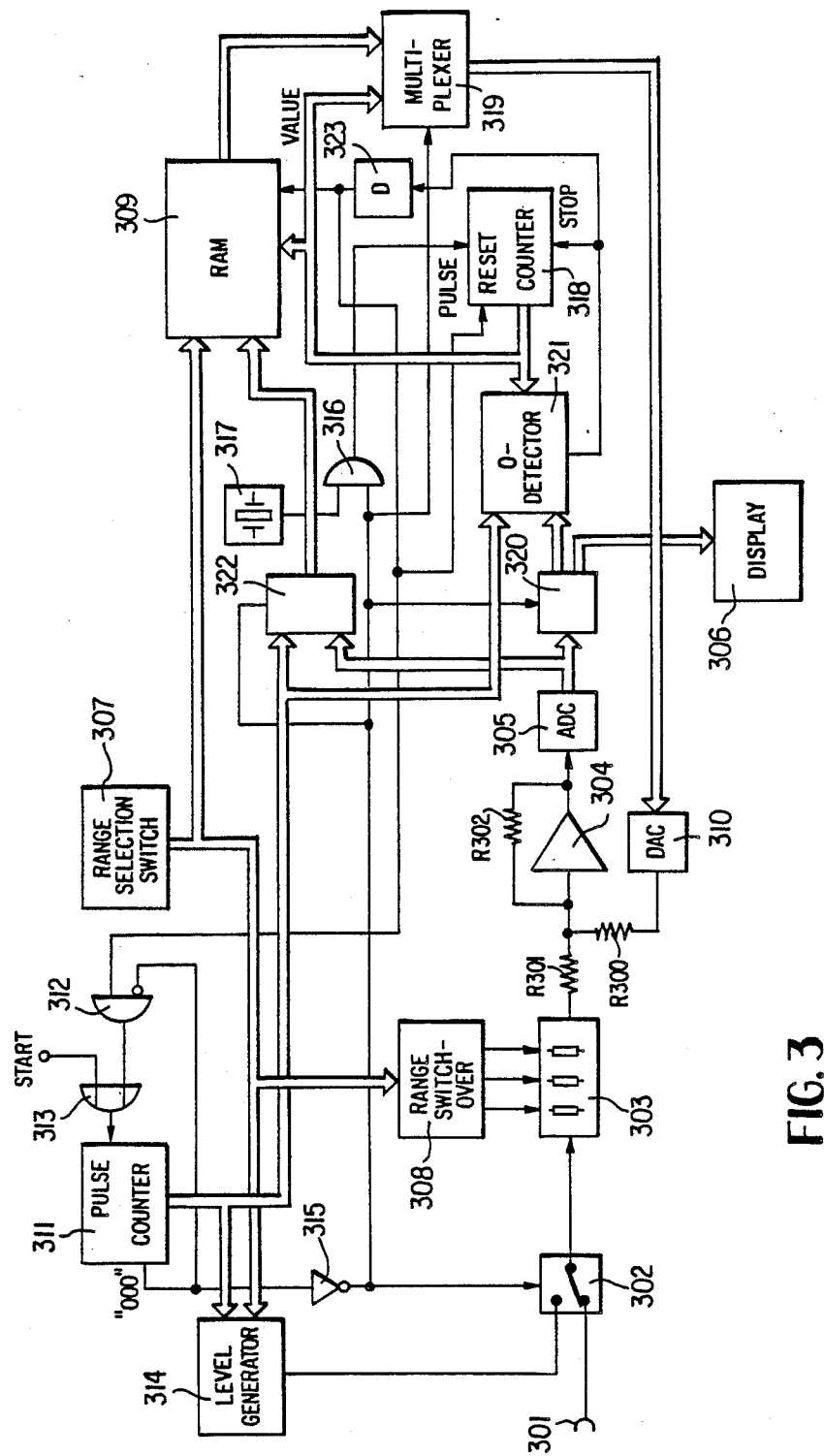

Other advantageous embodiments of the invention are defined by the dependent claims and will be described in further detail below in the description of the preferred embodiment of the invention, taken in conjunction with the drawings. Shown are:

FIGS. 1a–c, a basic circuit of the input divider with amplifier in various switching states;

FIG. 2, a total circuit of the divider stages with amplifiers and calibration ability; and FIG. 3, details of the calibration portion.

The following description of a preferred exemplary embodiment will be provided in conjunction with the drawings, and in terms of the principle of the input divider having a following potentiometrically wired operational amplifier, reference is made to FIGS. 1a–c, while the remaining details will be apparent from FIG. 2.

FIGS. 1a–c show how the resistor/capacitor combinations R13/C13 and R14/C14—individually or in common, depending on the measurement range to be encompassed—that follow a complex input resistor (R11 parallel to C11) either are connected, toward the inverting input (summing point S) of the operational amplifier V1, parallel to a capacitor combination R12/C12, or are connected to the summing point S with the input or output reference point and the noninverting input (+) of the amplifier V1. A resistor/capacitor combination R15/C15 (all resistor/capacitor combinations are connected parallel) connects the summing point S to the output of the amplifier V1.

Since the summing point S and the reference point for the input and output signal are virtually indistinguishable in terms of potential, these points can be considered to be combined in terms of the input signal. The ratios as viewed from the input do not vary as a result of these switchovers. However, the amplification ratio ($U_A/U_E$) does vary, and this is determined by the ratio of the resistances of the output toward the summing point S—with respect to the resistors from the input to the summing point S. The stray potentials are likewise not restricted by the switchovers.

The detailed exemplary embodiment shown in FIG. 2 will now be described. The input signal of the circuit is supplied via a shielded coaxial input socket, for instance a BNC socket. This socket is connected first to the protective safety resistor R11. This protective resistor must have a high value, must be voltage-proof and highly accurate.

Connected parallel to it is the acceleration input capacitor C11, which for safety reasons must also be high-voltage-proof. It is advantageously embodied in a multilayer card by two capacitor coatings, which with equivalent surface area are represented in the interior of the multilayer card by two metal coatings located on different planes and separated by the base material as a dielectric. In this manner the otherwise very expensive special capacitor is realized in a highly safe embodiment without additional expense.

Furthermore, the components at this immediate input portion must have corresponding leakage paths, and the same applies to the spacing of the fastening bores in the circuit board.

Following the protective resistor is the operating mode switch (marked BAS). It also serves as the switch for turning the device on.

In the first position shown (OFF), the device is switched off; the input resistance of the device is formed from the resistor R11 and the resistor R12 connected in series with it.

In the second position, DC (DIRECT CURRENT), the protective resistor is connected via the switch yoke. At the same time, a further switch yoke is moved mechanically parallel in the BAS code switch, which turns the device on.

In the third position of the BAS, that is, GD (GROUND), the protective resistor R11, as in the OFF position, is switched together with the additional resistor R12 to form the input resistance, while at the same time the second switch bridge of the BAS connects the input of the calibration divider, via a resistor R13 equivalent to the input resistor R10, to the central measuring ground, in order in the GROUND position to simulate a measurement instrument input connected to GROUND.

In the fourth position of the BAS, finally, the position AC (ALTERNATING CURRENT), the protective resistor R10 is connected via a voltage-proof coupling capacitor C10 to the calibration divider circuit. At the same time, a further switch yoke in the BAS code switch is moved mechanically parallel, and the switch reports this position to the digital evaluation means for the switch position.

Since the coupling capacitor operates in a high resistance circuit portion, the requirement for a very low coupling time constant is satisfied.

The connection of the protective resistor with the calibration line now makes it possible, via the measurement range decade switch (MBSD) to connect the resistors R13 and R14 with virtual ground or actual ground such that the amplifications listed in the table for the potentiometrically connected video preamplifier result in the switch positions 1-11, as is theoretically described in the explanation of the calibration divider and as is required in combination with the second step measurement range switch.

Connected in parallel with the voltage divider resistors, R13, R14, R15 are the capacitors C13 and C16, C14 and C17, and C15, respectively. They represent the compensating capacitors mentioned in the foregoing section. The combination of one trimming and one fixed capacitor each improves the adjustability and temperature coefficient. The MBSD is formed from a two-plane switch having 11 steps.

Two switch bridges connect the current divider resistors, in the first switch positions, via the calibration switch to the potentiometric input of the preamplifier V1. From the fifth position on, the second short-circuit yoke initially connects the resistor R14 to the central measuring ground, while the resistor R13 is still connected to the potentiometric input, and then from the eighth switch on up to the open position connects both resistors with the measuring ground. The layout of the switch contacts located opposite the ground contacts on the configuration shown makes it possible to attain all the variants of the required conjunction using two wiper bridges.

As already explained, the summing point, in terms of the system is a very important point of all the analog switching circuits. It serves not only as virtual ground for the current divider circuit but at the same time represents the following important system points:

Summing point for the supply of the correction current, generated by the DAC to the automatic null drift correction at the input point of the entire active amplifier train;

Summing point for the supply of the correction current generated by the DAC for null drift, for generating an electronic compensation voltage for an alternating voltage signal undergirded with a direct voltage signal (electronic AC coupling);

Measurement point of the offset voltage of the operational amplifier V1 with the aid of the simulation resistor R35, which is applied to the central measuring ground via the switch M controlled by the microprocessor;

Summing point for the supply of the signal current arriving from the calibration line via the switch S1.

This summing point of the potentiometrically wired amplifier is thus used for automatic calibration of the entire analog system. Given the fact that the setting of the operational load preceding the summing point, and the measuring divider, represent passive networks comprising precision elements having a low-temperature coefficient and a considerable long-term stability and reliability, autocalibration enables permanent automatic null drift correction, and even a calibration of the entire system, including the analog/digital converter, or in other words enables them prior to every measuring sequence during operation of the intermittant measuring operation, or alternatively prior to each individual measurement instant (before each sampling event of the sampling operation). It is also possible with this system to control the DA converter (DAC) from the microprocessor, via a signal—for example a 12-bit signal—such that the signal input is supplied incrementally, within the entire transmission range, with direct voltage increments, so that via the analog/digital converter, the microcomputer is supplied bit by bit for comparison and thus for storage in a calibration table. The autocalibration has the following course, in detail:

Phase I: The microprocessor puts a switch S32 in the working position and measures the offset voltage via the resistor R35.

Phase II: Because the microprocessor knows, via the BAS encoding, which measurement range is switched on, it knows the source resistance of the calibration line viewed from the summing point. Thus it can use the measurement value of phase I to calculate the offset voltage that corresponds to the particular source resistance and can deliver this via the DAC in phase III.

Phase III: The microprocessor, with the switch S31 open, supplies calibration signals in increments via the DAC via the operational amplifier train and via the ADC back to the microprocessor in digitized form. The microprocessor stores a corresponding calibration table, in order to be able to evaluate the signals, arriving in phase IV and to be measured, in an appropriately calibrated manner.

Phase IV: The switch S32 is opened, the switch S31 is closed, and the measurement phase can begin. During the measurement phase, the null drift correction voltage ascertained during phase II is supplied via the DAC, in order to enable optimal exploitation of the window of the ADC.

There are two decisive advantages to introducing the autocalibration system. First it can thereby be attained that the null drift stability and temperature drift of the all the analog stages can be assured, and accordingly the expenditure for these stages can be kept within limits. For example, no precision resistors need to be used in the second calibration divider. The temperature drift of the semiconductor components and of the passive components no longer plays a significant role. The decisive advantage, however, is the long-term stability and the thereby attained great reliability, which was previously inconceivable in low-priced devices of this size category.

Aside from these aspects having to do with value analysis and reliability, there is a further very large number of reasons for which this system principle is predestined for special applications; for example, whenever a high-speed digital/analog converter is used.

The input portion (for one channel) shown on FIG. 2 will now be described in detail.

The analog signal appearing at the input E is delivered via a high-resistance protective safety resistor R31 along with a parallel safety capacitor C31 to the operating mode switch S1. The operating mode switch enables the selection of the operating modes "direct voltage coupling (DC)", "alternating voltage coupling (AC)", "input short-circuited (GROUND)", by means of a mechanical slide switch. At the same time, by way of this switch the device, with the switch position "OFF" can be switched on or off with respect to its supply voltage; the corresponding contact set has been omitted from the drawing for the sake of simplicity.

The operating mode switch comprises a mechanically parallel-connected encoding switch, which reports to the following microcomputer of the digital processing portion the particular position of the switch slide by connecting a line "D" with one of three further lines L1-L3. The fourth position is reported by the fact that no connection exists.

Aside from the operating mode switch, a further measurement range switch S21/S22 is provided (per channel), which enables adaptation of the input signal amplitude to the level ratios of the further stages. The measurement range switch comprises two main portions S21 and S22 each. It is embodied from an 11-step multi-slide switch, the first portion of which comprises the decade measurement range switch s21. This switch serves to perform amplification and attenuation of the input signals via resistance networks variable by means of the switch, with respect to a summing point.

The following table shows, for the measurement range position MBS and the vertical coefficient n, the associated values for the reference voltage Yb, the decimal attenuation a1, the amplification factor v1 of the divider stage, its nominal output voltage Ua1, the attenuation a2 prior to the channel amplifier and the respective amplification v2 of the channel amplifier.

| MBS (V/DIV) | Yb | a1 (V) | v1 | Ua1 | a2 (V) | v2 |
|---|---|---|---|---|---|---|
| 0.01 | 0.06 | 1 | 5 | 0.30 | 1 | 7.8125 |
| 0.02 | 0.12 | 1 | 5 | 0.60 | 1 | 3.90625 |
| 0.05 | 0.30 | 1 | 5 | 1.5 | 0.4 | 3.90625 |
| 0.1 | 0.6 | 1 | 5 | 3.0 | 0.2 | 3.90625 |
| 0.2 | 1.2 | 0.05 | 10 | 0.6 | 1 | 3.90625 |
| 0.5 | 3.0 | 0.05 | 10 | 1.5 | 0.4 | 3.90625 |
| 1.0 | 6.0 | 0.05 | 10 | 3.0 | 0.2 | 3.90625 |
| 2.0 | 12 | 0.05 | 1 | 0.6 | 1 | 3.90625 |
| 5.0 | 30 | 0.05 | 1 | 1.5 | 0.4 | 3.90625 |
| 10.0 | 60 | 0.05 | 1 | 3.0 | 0.2 | 3.90625 |
| 20.0 | 120 | 0.05 | 1 | 6.0 | 0.1 | 3.90625 |

The output voltage is uniformly 2.345 V.

The resistors and capacitors of the divider circuits, in terms of their designation, correspond to those of the foregoing basic illustrations. Further trimmers connected in parallel with the divider capacitors are provided with a prime after the reference numeral.

With the aid of a calibration multiplexer M, embodied by analog switches, the analog signal input E can be separated from the summing point and controlled via a digital/analog converter DAC, by the CPU of the following microcomputer. A direct voltage signal is delivered in increments to the summing point S via the resistor R34. The direct voltage signal is thus supplied at the input of the amplifier chain, travels through the entire amplifier chain, and is returned to the microcomputer for evaluation in the form of a digital signal via an analog/digital converter. Because the microcomputer has generated the set point signals itself, it can store the arriving actual signals in a calibration table and thus, during the ensuing measurement operation in which the calibration multiplexer turns the signal source back on, it can perform a possible necessary correction in evaluating the arriving actual signals in accordance with the stored correction tables.

The summing point S exerts the decisive influence on the versatility of the device. The summing point is formed by the virtual ground of a potentiometrically wired direct voltage broad band amplifier. At the summing point, the direct voltage signals coming from the digital/analog converter can be connected for automatic null drift correction and for autocalibration. At the same time, it serves as a virtual ground for the amplifier V1 with the calibration line connected via the decade measurement range switch S21.

The measuring preamplifier V1 is formed by a push-pull bridge amplifier constructed of discrete semiconductor components and it amplifies the input signal, in cooperation with the decade measurement range switch, which is constructed as a current divider wired potentiometrically and represents a calibration divider. In this manner it separates the calibration line, which enables a decade-type stratification of the entire amplification of 5-fold, 0.5-fold, 0.05-fold, by the step switch following the amplifier V1.

In order to be able to control the great number of measurement ranges without excessive expense in the high-resistance portion of the input circuit embodied as a calibration line, the decade divisions in the eleven individual measurement range steps are generated by the decade measurement range switch. In the level adapter stages 1, 0.5, 0.2 located in between, the additional is performed after the first measuring preamplifier V1, acting as a separating amplifier, because with the output of this amplifier, a low-resistance source is already available and thus the step divider resistors, selected by a step switch S22, are also available, and do not require compensation capacitors.

The step switch S22 is accordingly connected between the measuring preamplifier V1 and a following measuring amplifier V2 and enables the attenuations with the factors of 1, 0.5, 0.2. Parallel to the step switch S22, a further contact series—not shown in the drawing—of the step slide switch S22 is provided, which series adapts the direct voltage output signals generated by the digital/analog converter to the required voltage level (or current levels) at the input of the summing point corresponding to the step switch position.

Following the step switch is the measuring amplifier V2, which is again designed as a broad band direct voltage amplifier and amplifies the entire level, as required, of the level window at the input of the parallel and analog/digital converter. The level window used has a width of approximately 2.5 V.

The divider of the stage including the amplifier V2 is—in cooperation with the divider of the first stage—affected in a different manner by the switch S2. Although the amplifier stage V2 is also potentiometrically wired, the capacitors connected in parallel with the active resistors are already omitted. A tap located between the resistors R22 and R23 is connected to the combined terminals of one side of the slide switch S22, at this point, in accordance with the increasing lessening of the amplification factor of the amplifier V2, is first connected to the connecting point of the two resistors R21 and R22 and then with transverse resistors which together with the resistors R21 and R22 form a voltage divider with respect to the reference potential, from which the resistor R23, which together with the resistor R27 determines the amplification factor of the operational amplifier V2, obtains its input voltage. Depending on the amplification factor selected, the connecting point of the resistors R22 and R23 is applied to different taps of the series circuit comprising the resistors R24, R25 and R26. Thus by suitable adjustment of the divider comprising the switches S11 and S12, the voltage reductions required for the intended input voltage range of the device can be attained.

In order to enable evaluation of the signals having a high band width, a following parallel analog/digital converter having the maximum possible sampling rate is used. This so-called flash converter is formed at the input by means of a parallel connected chain, quantified via a reference voltage divider, of high-speed comparators. At the sampling instant, signal recognition is performed by whichever one of the comparators (in an 8-bit converter, there are 256 comparators) the voltage of which has just exceeded or fallen below its reference voltage value. An encoding circuit following the comparators transmits the recognized digital value, for instance in the form of an 8-bit-wide binary codification; this codification makes the signal available at the clock rate of the sampling frequency at the output of the analog/digital converter.

The digital data generated by the analog/digital converter are managed by the CPU of the following microcomputer. The 8-bit CPU includes an on-board RAM, ROM and an oscillator as well as timer inputs and serial interfaces.

The CPU serves as a central computer, in order to process all the commands entered from the keyboard in accordance with the program contained in the internal or external program memory, to read out the signals furnished by the high-speed register and evaluate them in accordance with the most various instructions, convert them, store them in the memories, compare them with other signals, perform analyses, and finally pass them on, in suitable form and with a suitable interface, to a video display terminal or graphics processor, printer or function generator output interface or other interface processors, via the BUS. The data for the direct voltage compensation and the calibration are stored in a memory labeled "CAL". This is also where the tables that perform the bit-by-bit calibration are located.

A notable feature of the described circuit layout is that the two-stage slide switch, in terms of its contacts, is always directly adjacent to those electrical components of which the contacts are to be connected. Between the contacts of the two stages in succession in the actuation direction of the switch, an amplifier is provided on the board, thus spanning the spatial distance, generated by the amplifier, from an actuation element of the switch is spanned.

Preceding the divider switch in the actuation direction is the operating mode switch, which is embodied independently of the divider switch, but has a similar structure.

By means of this kind of circuit, the input circuit of an oscillograph can be constructed with spatially optimal short connecting routes, so that the influence of the signals on one another can be kept to a minimum. The circuit is also particularly suitable for a two-channel symmetrical construction, if the slide switches operate along the outside of the board with U-shaped contact elements, or are disposed in the central region of a board beside one another. If they are disposed along the outer edges, the further advantage is also attainable that the decoupling of the two channels can be favorably realized so that the signals virtually do not affect one another, especially if in the region separating the two channels further circuit elements associated with both channel amplifiers are provided, such as the current supply circuit or a processor that continues the signal processing following a digital/analog conversion.

This kind of construction, with appropriate miniaturization of the other components, enables the disposition of a complete oscillograph circuit on one board and thus is an important prerequisite for embodying a hand-held measuring instrument for processing electrical input signals of highly different amplitude ranges. In this connection it should be taken into account that the size of an electrical circuit board—even if it is embodied by multilayer techniques—is substantially determined by the number of conductor tracks that are to be accommodated there. Accordingly, the dimensions can substantially be reduced only if provisions are made from the very beginning, by means of the constructional layout, to generally shorten the length of the tracks. This kind of provision also promotes the other properties of the device, because it results in lower losses and less mutual signal leakage. In this manner, other elements that reestablish the quality of the signal to be processed can be dispensed with, with the overall result of further reducing the size of the device.

In FIG. 2, along with the amplifier train described above, the other component groups that are part of the digital oscilloscope are shown in block circuit form, with the digital signals from the keyboard, the digital/analog converter (DAC), the processor and memory (CPU), the calibration apparatus (CAL), the analog/- digital converter (ADC) and the liquid crystal display (LCD) are connected to a common BUS. The additional amplifier/divider train disposed on the opposite side of the corresponding circuit board is also represented by a rectangular block. The arrangement of the components is in mirror symmetry to what is shown in the upper portion of the figure. In the case where the slide switches S1, S21 and S22 are disposed on the edge of the board, the drawing sheet should be imagined as being folded along the broken line, representing a shield, that leads along the middle of the contacts of the switches. The result is a readily understood illustration of the arrangement of the contacts of the switches at the edge of a board provided with switching contacts on both sides; the moveable contact elements are in the shape of a U or $\Omega$, corresponding to the actual construction.

In FIG. 3, an exemplary embodiment of the calibration apparatus is shown in further detail. During measuring operations the input signal from the measuring input 301 via a reversing switch 302 proceeds in the analog processing portion via a level adapter 303 with reversible resistors to the following operational amplifier circuit 304 via an analog/digital converter (ADC) 305 to a processing and display portion 306, where a display of the ascertained analog measured value takes place by digital means.

The operational amplifier 304 has resistors R301 and R302, which in potentiometric wiring determine the amplification, and the reversing means 303 preferably are connected with the resistor R301 or vary this value themselves as described above.

In order to compensate for processing errors in the analog processing train, as long as they originate in direct voltage or linearity errors, a calibration is performed at regular intervals for the individual measurement ranges. This calibration is performed between individual measurement cycles and is triggered by a "start" signal that is suitably generated by the system. The calibration is effected at a given time for the measurement range set by a range selection switch 307, which emits a digital signal that activates a switchover (block 308), which sets the resistors contained in block 303 in such a way that via the operational amplifier 304 the analog signal is varied in accordance with the desired signal level. The output signal of the range selection block 307 at the same time forms the digital addressing of a RAM 309, which receives the correction values in digital form that effect a compensation in the direction of the desired calibration. The output signal of the range selection switch addresses, or seeks, various addresses of the ranges in the RAM 309. Thus this signal also includes the higher-order bits of the total address signal.

The digital signal contained in the addressed location in memory of the RAM is supplied to a digital/analog converter 310, the analog output signal of which is delivered via a resistor to the virtual ground point of the operational amplifier 304. A substantial advantage is thus that the correction value always corresponds only to the relative error and is independent of the range selected. Thus the information contained in the digital values stored in the RAM 309 is utilized optimally and makes possible a direct indication of the relative deviation.

If a specific measurement range is set, a calibration operation for this measurement range is triggered by the input signal "start". The output "000" of a counter 311, in the "HIGH" state, via an inverting input of the AND gate 312, blocks the signals reaching its clock input via its other input and an OR gate 313. Upon activation via the "start" input, the counter is set to the state "001", so that at the appropriate output the signal changes to the "LOW" state. As a result, the switch 202 is reset, so that the analog processing train is connected to the output signal of a level generator 314, which generates signals in steps that extend over the entire measurement range. The level generator 314 is in this sense also affected by the digital output signal of the range selection block 307. The signal "000" appearing at the output counter, via an inverter 315, reaches not only the reversing switch 302 but also an AND gate 316 which allows the clock signals of an oscillator 317 to reach a further counter 318. The output signals of this counter 318 are on the one hand passed to the input of the RAM 309 and there stored, optionally in response to a suitable signal, or are sent to a multiplexer 319, which via a suitable control input in the "calibration" mode allows the corresponding digital signal to reach the digital/analog converter 310, which generates the aforementioned compensation signal. The counter 319 counts from an initial signal status until the signal sent by the analog/digital converter 305 via a further multiplexer 320 to a null detector 321, displays the value "null".

The multiplexer 320 is connected through to this null detector 321 in the calibration state, while during measuring operation the output signals of the analog/digital converter are sent to the display 306.

The digital/analog converter is set such that a "null" output signal is located approximately in the middle of the range of the digital values that trigger the digital/analog converter. The counter 318 thus during its passage counts a combination of voltage extending from negative values toward positive values. The "null" output signal of the null detector, which indicates that the correct display value has been passed through, stops the counter 318 and—by means of a pulse delayed via a D element 320—assures via the "memorize" input of the RAM 409 that the counter value attained will be stored in the addressed memory location of the RAM. In the case of the first value emitted by the level generator 314, this is the value "null", so that in this case the setting required for the null drift compensation is maintained by the digital/analog converter 310. The signal at the output of the D element 320, via the "reset" input, resets the counter 318 and via the clock input of the counter 311 resets it forward by one value. As a result, the level generator 314 is set to the first stage, so that it emits an analog signal of a predetermined fraction of the maximum input signal.

Its final counter state corresponds to the maximum input signal value of the measurement range involved. The output signal of the counter also reaches the RAM 309, where it forms the low-order bits of the address, so that the intermediate values of the RAM 309 are run through as the status of the counter 311 progresses. The digital null detector is also supplied with the actual value of the counter 311, and this value is subtracted from the value that reaches the null detector 321 from the multiplexer 320. The null detector thus emits an output signal as soon as the two values are the same, that is, as soon as the output signal of the analog/digital converter corresponds to the predicted value.

In this manner, a predetermined measurement range is scanned point by point and a correction table is stored in memory in the RAM 309, so that the transmission range of the analog routes is linearized by means of the correction signals generated during measuring operation from the RAM 309. The low-order bits of the RAM 309 are addressed by the suitably set multiplexer 322 during the measuring operation by means of the output signal of the analog/digital converter 305, so that the correction value is ascertained by means of the measured value itself. What is displayed is the value established after a plurality of measuring cycles, because the measured value may possibly continue to vary because of the correction values.

In another version of the invention, only one null drift correction is performed via the digital/analog converter 310 and maintained for a particular measurement range, while the other ascertained correction values that are contained in the RAM 309 do not cause a variation of the output signal of the digital/analog converter 310 but instead directly correct the value reproduced in the display 306 arithmetically, and the addition of the value addressed in accordance with the measurement range in the RAM, the memory contents are once again arithmetically linked digitally to the output signal of the range selection 307.

The invention is not restricted in its embodiment to the preferred exemplary embodiment described above. Instead, a number of variants in conceivable, making use of the above-described solution even with embodiments that are fundamentally different.

I claim:

1. An attenuator for a signal processing device including an operational amplifier having a signal input terminal, an inverting virtual reference potential input terminal, a signal output terminal and a system reference potential terminal, the amplification factor of said operational amplifier being determined by the ratio of first and second impedances, said first impedance disposed between said signal input terminal and said inverting virtual reference potential input terminal of said operational amplifier, said inverting virtual reference potential input terminal operating as a virtual reference voltage terminal and said second impedance disposed between said inverting input terminal of said operational amplifier and said signal output terminal thereof,
    said first impedance comprising at least two resistors, each said resistor having first and second terminals, said first terminals being connected together and to said inverting virtual reference potential input terminal and
    switch means to couple selected ones of said second terminals of said resistors to said system reference potential terminal.

2. An attenuator as defined by claim 1, further including a fixed resistor connected in series between said signal input and said first impedance, and a connection in parallel with said first impedance for varying said first impedance.

3. An attenuator as defined by claim 1, further including one of a mechanical or electromechanical switch for effecting said switching.

4. An attenuator as defined by claim 1, wherein said means to switch is an integrated analog switch.

5. An attenuator as defined by claim 1, wherein said impedance elements have capacitive components embodied by at least one trimming capacitor.

6. An attenuator as defined by claim 1, wherein said level adapter circuit comprises two successive stages, each said stage containing one said operational amplifier with said switchable impedance elements, the first of said stages having a high-impedance calibration divider.

7. An attenuator as defined by claim 1, wherein the impedance values of said impedances are dimensioned to generate decade-type level adaptation jumps by switching a said impedance for one of connection with or disconnection from among said impedances determining the foregoing level adaptation.

8. An input circuit for a signal processing device having an attenuator as defined by claim 1, said circuit having a transmission window, further including means to supply at least one of a compensation current for direct voltage shifting or for correction of individual amplitude values within said transmission window via said virtual reference potential input terminal as a summing point of the amplifier.

9. An input circuit as defined by claim 8, further including a current divider having variable switchable branches, wherein said summing point being identical to the point where said current divider is joined together for level adaptation, the variable branches of said current divider being switched between said summing point and the voltage at said system reference terminal.

10. An input circuit as defined by claim 8, further including means to feedback a digital signal dependent on the signal at the output of the amplifier, wherein said means to supply is effected by said feedback, and means to convert said digital signal to an analog signal.

11. An input circuit as defined by claim 8, further including a memory having a digital signal stored therein for effecting generation of a signal to be fed back and a digital signal associated with the deviation of the analog output signal of said amplifier from a predetermined analog signal at a likewise predetermined analog input signal for providing said signal to be fed back.

12. An input circuit as defined by claim 11, further including means to feedback various signals distributed in terms of amplitude over the intended transmission range to effect calibration of the amplifier.

13. An input circuit as defined by claim 8, further including a memory for storing therein a digital value representative of the signal that is to be fed back and means to derive the signal that is to be fed back from the stored digital value by means of digital/analog conversion.

14. An input circuit as defined by claim 13, further including means to address by table the digital values stored in the memory in accordance with various input signal amplitudes which encompass the intended input signal range.

15. An input circuit as defined by claim 8, further including a memory addressed at least indirectly by means of a digitized measured value, the value contained in the addressed memory representing one of a correction or correcting value, and digital/analog converter means to supply said value to said summing point.

16. An input circuit as defined by claim 8, further including means including memory means to provide a signal identifying the selected measurement ranges for calibration, wherein the digital values ascertained for different measurement ranges are stored in said memory means.

17. An input circuit as defined by claim 8, further including a multi-stage amplifier coupled to the input of one of the amplifier stages to effect feedback.

* * * * *